(12) United States Patent
Yoshida

(10) Patent No.: US 6,534,801 B2
(45) Date of Patent: Mar. 18, 2003

(54) GAN-BASED HIGH ELECTRON MOBILITY TRANSISTOR

(75) Inventor: Seikoh Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/017,593

(22) Filed: Dec. 18, 2001

(65) Prior Publication Data
US 2002/0079508 A1 Jun. 27, 2002

(30) Foreign Application Priority Data
Dec. 19, 2000 (JP) ........................... 2000-385219

(51) Int. Cl.⁷ ................. H01L 31/0336; H01L 31/0328
(52) U.S. Cl. ................. 257/192; 257/190; 257/194; 257/195; 257/285; 257/590
(58) Field of Search .................. 257/24, 190, 192, 257/194, 195, 285, 590

(56) References Cited

U.S. PATENT DOCUMENTS 6,156,581 A  * 12/2000 Vaudo et al. ................. 438/22
6,177,685 B1 *  1/2001 Teraguchi et al. .......... 257/192
2001/0023964 A1 *  9/2001 Wu et al. .................... 257/368

FOREIGN PATENT DOCUMENTS

JP           11261052      *  9/1999

* cited by examiner

Primary Examiner—Minh Loan Tran
Assistant Examiner—Tan Tran
(74) Attorney, Agent, or Firm—Oblon, Spivak, McClelland, Maier & Neustadt, P.C.

(57) ABSTRACT

A GaN-based high electron mobility transistor (HEMT) has an undoped GaN layer where a two-dimensional electron gas layer is formed, the undoped GaN layer having a high electric resistivity enabling a pinch-off state to be obtained even when the gate bias voltage is 0 V. The GaN-based HEMT comprises a semi-insulating substrate on which a GaN buffer layer is formed. An undoped GaN layer is disposed on the GaN buffer layer and has an electric resistivity of not less than $1 \times 10^6$ $\Omega/cm^2$. An undoped AlGaN layer is disposed on the undoped GaN layer via a heterojunction such that an undercut portion is formed therebetween. An n-type GaN layer is further disposed in such a manner as to bury side portions of the undoped AlGaN layer and the undercut portion. The individual layers thus form a layered structure. A gate electrode G is formed on the undoped AlGaN layer, and a source electrode S and a drain electrode D are formed on the n-type GaN layer.

3 Claims, 2 Drawing Sheets

GAN-BASED HIGH ELECTRON MOBILITY TRANSISTOR

BACKGROUND OF THE INVENTION

1. Field of the Invention

The present invention relates to a high electron mobility transistor (HEMT) manufactured by using a GaN-based compound semiconductor. More particularly, it relates to a GaN-based HEMT comprising an undoped GaN layer forming a channel, wherein the undoped GaN layer is highly purified or remaining n-type impurities in the GaN layer caused by lattice defects during layer formation are compensated by a p-type impurity, thereby providing the channel with a high electric resistivity and enabling a pinch-off state to be realized when the gate bias voltage is set to zero volt.

2. Prior Art

There is an expectation for the HEMT as a high-output microwave device, for example. The HEMTs are manufactured by using mainly a GaAs-based compound semiconductor today.

However, the HEMT using the GaAs-based compound semiconductor does not have so high dielectric-breakdown electric field value at the heterojunction interface. Thus, the GaAs-based HEMT has difficulty in realization of high speed operation by the application of a high voltage to the gate electrode.

In view of this, recently, attention has been focused on an HEMT using a GaN-based compound semiconductor which has a higher potential (about 2.6 times) of hetero barrier at the heterojunction interface and a larger (by about an order of magnitude) dielectric breakdown electric field value, than the GaAs-based compound semiconductor. The GaN-based HEMT also has excellent heat resistance, and trial and research for the GaN-based HEMT is under way.

For example, the GaN-based HEMT is produced by an MOCVD method as follows.

First, a buffer layer made of GaN is formed on a semi-insulating sapphire substrate. Then, an undoped (i-type) GaN layer is formed on the GaN buffer layer, using trimethylgallium as a Ga source and ammonia as an N source. Further, an n-type AlGaN layer is formed on the undoped GaN layer by using trimethylaluminum as an Al source and Si as an n-type impurity. After $SiO_2$ is deposited on the n-type AlGaN layer by a plasma CVD method, conventional photolithography and etching are performed, and thereafter predetermined materials are vapor deposited to form a gate electrode, a source electrode and a drain electrode at predetermined locations.

In such a layered structure, the portion of the n-type AlGaN layer where the gate electrode is formed functions as a source of electrons to be supplied to the undoped GaN layer located below. The supplied electrons form a two-dimensional electron gas layer at the heterojunction interface between the undoped GaN layer and the n-type AlGaN layer, specifically at an upper most layer portion of the undoped GaN layer. There, the electrons move at high speed, thereby realizing an HEMT operation. To realize the high mobility of the electrons, it is necessary that the undoped GaN layer has as little impurities or lattice defects as possible.

However, in the case of the HEMT with the above-described layered structure, usually a great number of lattice defects exist in the undoped GaN layer formed, for example, by the MOCVD method. Particularly, a great number of lattice defects due to dangling bonds of nitrogen atoms are present. These lattice defects remain as an n-type impurity which functions as a donor impurity (hereafter referred to as remaining n-type impurity). As a result, the formed GaN layer does not have a high resistance and instead exhibits the properties of an n-type semiconductor layer. Specifically, there is obtained a state as if an n-type impurity with a concentration of the order of $1 \times 10^{16}$ cm$^{-3}$ were doped, with the resulting electric resistivity of the order of 500 $\Omega$/cm$^2$.

As this kind of state lowers the electric resistivity of the undoped GaN layer, a problem arises that a pinch-off state cannot be realized even when the gate bias voltage is set at 0 V.

Thus, in the conventional GaN-based HEMTs, the n-type impurity is effectively doped in the undoped GaN layer due to the above-mentioned problems arising during the film formation process. As a result, the undoped GaN layer cannot be given a high resistance, preventing a sufficiently high enough electron mobility and making it impossible to realize a pinch-off state even if the gate bias voltage is set at zero.

OBJECT AND SUMMARY OF THE INVENTION

It is therefore an object of the present invention to provide a novel GaN-based HEMT which can solve the above-mentioned problems of the prior art and remove the influence of the remaining n-type impurity, whereby the electric resistivity of the undoped GaN layer can be greatly increased to enable the high mobility of the electrons while making it possible to realize a pinch-off state when the gate bias voltage is set at 0 V.

To achieve this objective, the GaN-based HEMT according to the present invention comprises a semi-insulating substrate on which a buffer layer is formed, wherein a layered structure is further formed on the buffer layer, the layered structure comprising:

an undoped GaN layer having an electric resistivity of not less than $1 \times 10^6$ $\Omega$/cm$^2$;

an undoped AlGaN layer disposed on the undoped GaN layer via a heterojunction with an undercut portion formed therebetween; and an n-type GaN layer disposed in such a manner as to bury side portions of the undoped AlGaN layer and the undercut portion, wherein:

a gate electrode is formed on the undoped AlGaN layer, and a source electrode and a drain electrode are formed on the n-type GaN layer.

The undoped GaN layer may preferably be formed by doping a p-type impurity during the layer formation process to compensate the remaining n-type impurity.

DETAILED DESCRIPTION

Figure 1:
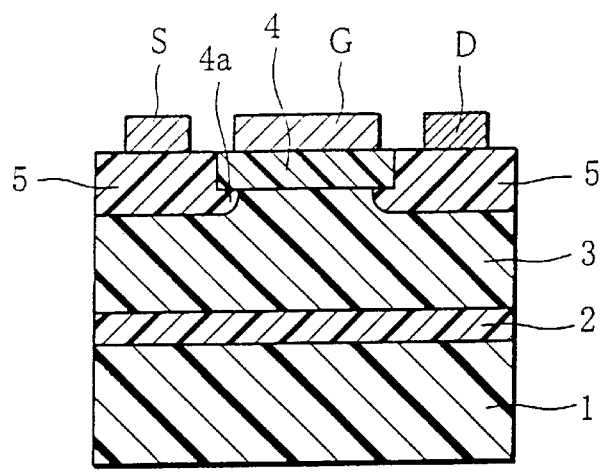
FIG. 1 is a sectional view of an HEMT according to an embodiment of the present invention.

The basic structure of an HEMT according to the present invention is described below referring to FIG. 1. One example of the HEMT of the present invention is shown in FIG. 1.

A layered structure of the HEMT shown is formed by a combination of an epitaxial crystal growth method such as the MOCVD and MBE methods, and photolithography. Initially, a buffer layer 2 is formed on a semi-insulating substrate 1, and then an undoped GaN layer 3 to be described later is formed on the buffer layer 2.

On the undoped GaN layer 3 is disposed an undoped AlGaN layer 4 via a heterojunction. An undercut portion 4a is formed between a lower face on each side of the undoped AlGaN layer 4 and the undoped GaN layer 3. An n-type GaN layers 5, 5 are formed on the undoped GaN layer 3 in such a manner as to bury both sides of the undoped AlGaN layer 4 and the undercut portion 4a.

A gate electrode G made of Au, for example, is formed on the undoped AlGaN layer 4. A source electrode S and a drain electrode D, both made of Al, for example, are formed on the n-type GaN layers 5, 5, respectively, on both sides of the undoped AlGaN layer 4.

The semi-insulating substrate 1 is preferably made of a material which is in lattice alignment with the respective semiconductor materials successively undergone layer formation thereon. However, there is no such material as far as GaN materials are concerned. Accordingly, the material for the substrate may be a semi-insulating material such as a single crystal of Si or sapphire, for example. As the material for the buffer layer 2, GaN is usually selected.

In the HEMT with such a layered structure, a two-dimensional electron gas layer is formed at an upper-most layer portion of the undoped GaN layer 3 during operation, which results in high mobility of electrons. In the HEMT according to the present invention, the electric resistivity of the undoped GaN layer 3 is made not less than $1 \times 10^6$ $\Omega/cm^2$, so that a pinch-off state can be realized when the gate bias voltage is set at zero.

The undoped GaN layer 3 with such a high resistance can be formed as follows. Specifically, a p-type impurity such as C or Mg is doped simultaneously during the formation of the undoped GaN layer. By so doing, the aforementioned remaining n-type impurity (lattice defect) caused during the formation of the undoped GaN layer can be compensated, whereby the effective carrier concentration in the undoped GaN layer decreases. The concentration of the remaining n-type impurity in the undoped GaN layer varies depending on the crystal growth method employed and its growth conditions; Normally, however, it is in the range from $5 \times 10^{16}$ to $5 \times 10^{15}$ $cm^{-3}$. Thus, by setting the dope amount of the p-type impurity in the range of $2 \times 10^{17}$ to $5 \times 10^{16}$ $cm^{-3}$, the electric resistivity of the resultant undoped GaN layer can be made $1 \times 10^6$ $\Omega/cm^2$ or more.

The p-type impurity may be doped into the undoped GaN layer 3 such that the concentration of the p-type impurity at the upper-most layer portion adjacent the junction interface with the undoped AlGaN layer is one-order or more of magnitude higher than that of the remaining n-type impurity. The supply of electrons from the undoped AlGaN layer 4 can be reliably prevented, which is very effective in realizing the pinch-off state.

The above-described HEMT can be produced by the following manner.

Figure 2:
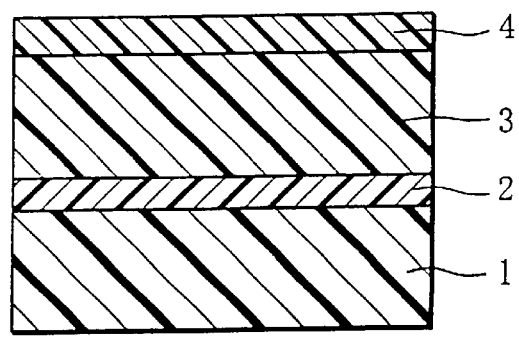
FIG. 2 is a sectional view showing a layered structure of the HEMT according to the present invention.

As shown in FIG. 2, a slab-layered structure is formed by successively forming on the substrate 1 the buffer layer 2, the undoped GaN layer 3 and the undoped AlGaN layer 4. When the undoped GaN layer 3 is formed, C is doped, for example, to compensate the remaining n-type impurity.

Figure 3:
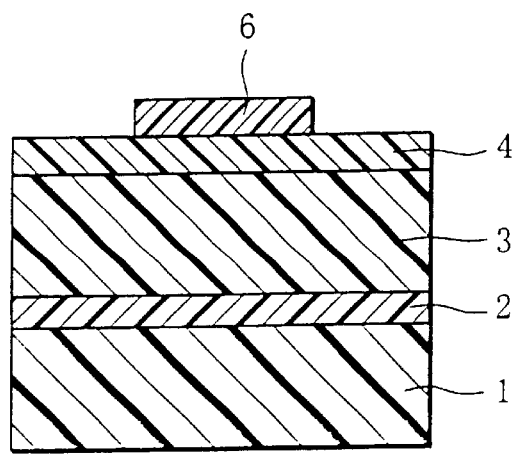
FIG. 3 is a sectional-view of the layered structure of FIG. 2 where an $SiO_2$ film mask has been formed.

Next, an $SiO_2$ film, for example, is formed on the entire surface of the undoped AlGaN layer 4. Thereafter, the $SiO_2$ film is removed except for a portion 6 where the gate electrode is to be formed, whereby the undoped AlGaN layer 4 is exposed (FIG. 3).

Figure 4:
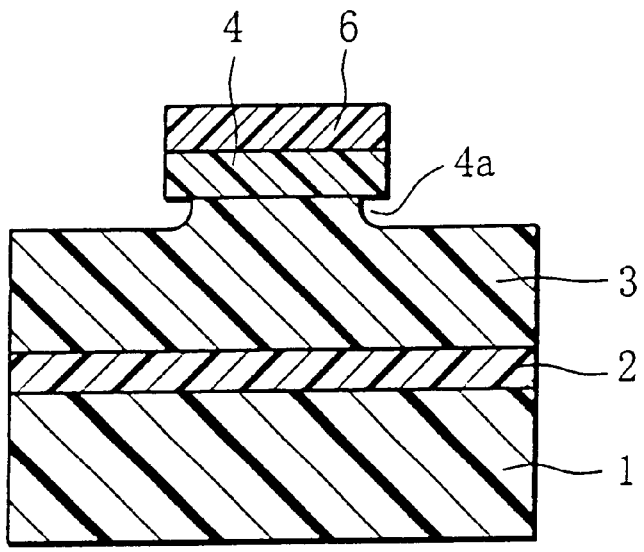
FIG. 4 is a sectional view of the layered structure of FIG. 3 after a dry etching has been performed.

A dry etching such as plasma etching is then performed by using the $SiO_2$ film 6 as a mask, thereby removing the exposed undoped AlGaN layer 4 and a part of the undoped GaN layer 3 below (FIG. 4). At this time, the etching conditions are controlled such that an undercut portion 4a is formed between the undoped GaN layer 3 and the undoped AlGaN layer 4.

Figure 5:
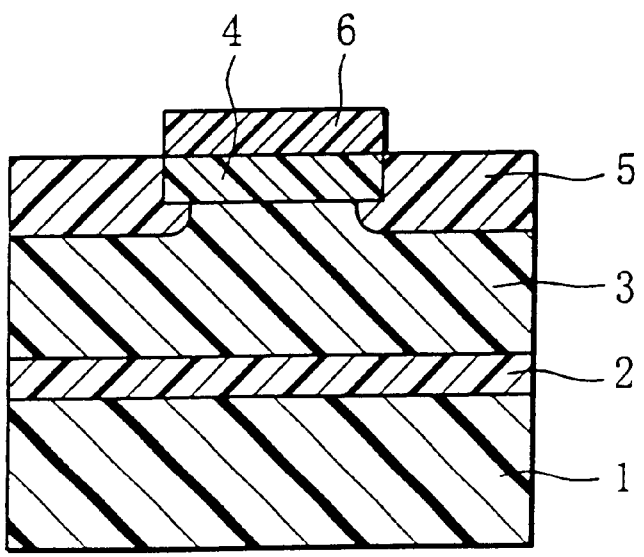
FIG. 5 is a sectional view of the layered structure of FIG. 4 after an n-type GaN layer has been formed.

Thereafter, a selective growth method, for example, is used to form the n-type GaN layer on the exposed undoped GaN layer 3, using Si, for example, as the n-type impurity. Simultaneously, the undercut portion 4a is buried by the n-type GaN (FIG. 5).

The undercut portion 4a is provided so that a good electric conduction can be obtained between the two-dimensional electron gas layer, which is generated at the junction interface between the undoped GaN layer 3 and the undoped AlGaN layer 4, and the n-type GaN layer 5.

The $SiO_2$ film 6 on the undoped AlGaN layer 4 is then removed, and an $SiO_2$ film is newly provided over the entire surface. This is followed by the formation of the electrodes, as described below.

Photolithography and etching are used in combination to remove portions of the $SiO_2$ film where the source and drain electrodes are to be formed, thereby forming openings exposing the n-type GaN layer 5. Al, for example, is then vapor deposited on the e-type GaN layer 5 exposing from these openings to form the source electrode S and the drain electrode D. The $SiO_2$ film is then removed and an $SiO_2$ film is again formed on the entire surface. A portion of the $SiO_2$ film where the gate electrode is to be formed is removed by photolithography and etching, thereby forming an opening exposing the undoped AlGaN layer 4. Au, for example, is then vapor deposited there to form the gate electrode G, thereby producing the HEMT as shown in FIG. 1.

EXAMPLE

By using an ultravacuum apparatus with a growth chamber and a patterning chamber, a gas source MBE was performed to form a GaN buffer layer 2 with a thickness of 50 nm on an Si single crystal substrate 1 at a growth temperature of 640° C. Metal Ga ($5 \times 10^{-7}$ Torr) was used as a Ga source and dimethylhydrazine ($5 \times 10^{-5}$ Torr) as an N source.

Then, the N source was switched to ammonia ($5 \times 10^{-5}$ Torr), and a gas source MBE was performed at a growth temperature of 780° C., thereby forming an undoped GaN layer 3 with a thickness of 2000 nm. The carrier concentration of the undoped GaN layer 3 was controlled to $1 \times 10^{15}$ $cm^{-3}$ by doping a p-type impurity of Mg ($1 \times 10^{-8}$ Torr).

In a separate experiment, the same undoped GaN layer was formed under the same conditions. When its electric resistivity was measured by a contactless-type contact resistance measurement apparatus, the reading was 100 $M\Omega/cm^2$.

Thereafter, metal Al ($1 \times 10^{-7}$ Torr) was supplied and a gas source MBE was performed at a growth temperature of 850° C. to form an undoped $Al_{0.2}Ga_{0.8}N$ layer 4 with a thickness of 30 nm, whereby the layered structure was formed as shown in FIG. 2.

An $SiO_2$ film was then formed over the entire surface of the undoped $Al_{0.2}Ga_{0.8}N$ layer 4 with the layered structure by a plasma CVD apparatus. A patterning process was then effected to remove the $SiO_2$ film except where the gate electrode was to be formed. This was followed by a dry etching process using plasma, thereby forming the layered structure as shown in FIG. 4. During the etching, a portion of the undoped GaN layer 3 was removed to a depth of 40 nm below the junction interface with the undoped AlGaN layer 4. At the same time, an undercut portion 4a was formed, extending about 20 nm inwardly from both sides of the undoped AlGaN layer 4.

Thereafter, a selective growth was effected by using metal Ga ($5\times10^{-7}$ Torr) as a Ga source, ammonia ($5\times10^{-6}$ Torr) as an N source and Si ($5\times10^{-8}$ Torr) as an n-type impurity, thereby burying the undercut portion 4a and forming an n-type GaN layer 5 with a thickness of 40 nm, as shown in FIG. 5. The Si concentration in the n-type GaN layer was $2\times10^{19} cm^{-3}$.

The $SiO_2$ film on the undoped AlGaN layer 4 was then removed by etching using hydrofluoric acid, and again an $SiO_2$ film was formed on the entire surface by a plasma CVD method.

Then a patterning process was performed to form openings to expose the surface of the n-type GaN layer 5 where the source and drain electrodes were to be formed, while using as a mask the portion of the $SiO_2$ film where the gate electrode was to be formed. Al was vapor deposited on the surface of the n-type GaN layer 5 exposing from openings to form the source electrode S and the drain electrode D. The portion of the $SiO_2$ film where the gate electrode was to be formed had a thickness of 100 nm.

The $SiO_2$ film was then removed by etching with hydrofluoric acid, and an $SiO_2$ film was again formed on the entire surface. An opening was then formed to expose the surface of the undoped AlGaN layer 4 where the gate electrode was to be formed. Al was then vapor deposited on the exposed surface to form the gate electrode G, thereby producing the HEMT as shown in FIG. 1.

In this HEMT, Ids remained 0 mA/mm when the gate bias voltage was set at 0 V and Vds was varied. When Vgs was set at +3V, the HEMT indicated an Ids of 500 mA/mm.

While in the above example, the layered structure was formed by gas source MBE, an MOCVD method may also be used. Further, while the film forming of the n-type GaN layer 5 was effected by the selective growth method, Si may be ion-implanted into the undoped GaN layer to thereby obtain an n-type region with a low resistance.

While Mg was used as the p-type impurity in the undoped GaN layer, other impurities such as carbon (C), Zn, Be and Cd, or their combinations may be used instead.

The doping concentration of the p-type impurity may be selected from a wide range of $5\times10^{16}$ cm$^{-3}$ to $1\times10^{21}$ cm$^{-3}$, depending on the quality of the undoped GaN crystal.

If the p-type impurity diffuses into the AlGaN layer, the supply of the p-type impurity may be terminated prior to the completion of the formation of the GaN layer so that an upper-most portion of the GaN layer with a depth of 5 to 10 nm is undoped and the AlGaN layer may be formed thereon.

Furthermore, while the undoped AlGaN layer 4 had the composition $Al_{0.2}Ga_{0.8}N$, it may have a general composition of $Al_xG_{1-x}N$ ($0 \leq x \leq 1.0$).

In order to obtain a better contact between the gate electrode G and the undoped AlGaN layer 4, the gate electrode G may be formed after forming a thin layer of InGaN or GaN on the undoped AlGaN layer 4.

As is apparent from the foregoing description, the GaN-based HEMT of the present invention can realize the pinch-off state even when the gate bias voltage is zero. This is because of the doping of the p-type impurity during the layer formation of the undoped GaN layer. The p-type impurity thus doped compensates the great amount of the remaining n-type impurity, i.e., lattice defects, that arises during the formation of the undoped GaN layer in which a two-dimensional electron gas layer is formed. As a result of the compensation, the resultant undoped GaN layer has an electric resistivity of not less than $1\times10^6$ $\Omega/cm^2$.

What is claimed is:

1. A GaN-based high electron mobility transistor comprising a semi-insulating substrate on which a buffer layer is formed, wherein a layered structure is further formed on the buffer layer, the layered structure comprising:

an undoped GaN layer having an electric resistivity of not less than $1\times10^6$ $\Omega/cm^2$;

an undoped AlGaN layer disposed on the undoped GaN layer via a heterojunction with an undercut portion formed therebetween; and an n-type GaN layer disposed in such a manner as to bury side portions of the undoped AlGaN layer and the undercut portion, wherein:

a gate electrode is formed on the undoped AlGaN layer, and a source electrode and a drain electrode are formed on the n-type GaN layer.

2. The GaN-based high electron mobility transistor according to claim 1, wherein the undoped GaN layer is doped with a p-type impurity.

3. The GaN-based high electron mobility transistor according to claim 2, wherein the p-type impurity is selected from the group consisting of C, Mg, Si, Zn, Be and Cd.

* * * * *